(12) United States Patent
Hogan

(10) Patent No.: US 6,594,171 B1
(45) Date of Patent: Jul. 15, 2003

(54) MEMORY SYSTEMS AND METHODS OF MAKING THE SAME

(75) Inventor: Josh N. Hogan, Los Altos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/093,020

(22) Filed: Mar. 7, 2002

(51) Int. Cl.[7] .................................................. G11C 5/02
(52) U.S. Cl. ............................. 365/52; 365/63; 365/72
(58) Field of Search ............................. 365/52, 63, 72, 365/51

(56) References Cited

U.S. PATENT DOCUMENTS

| | | | |
|---|---|---|---|
| 5,008,729 A | | 4/1991 | Wills et al. |
| 5,640,760 A | | 6/1997 | Val et al. |
| 5,943,254 A | * | 8/1999 | Bakeman et al. .............. 365/72 |
| 6,023,421 A | * | 2/2000 | Clinton et al. ................. 365/63 |
| 6,122,187 A | * | 9/2000 | Ahn et al. ..................... 365/52 |
| 6,150,868 A | | 11/2000 | Kim et al. |

* cited by examiner

Primary Examiner—Huan Hoang

(57) ABSTRACT

Memory systems and methods of making the same are described. In one aspect, a memory system may includes multiple memory layers that may be identical when manufactured and may be readily customized before or after the layers are arranged into a three-dimensional stack so that data may be sent to or retrieved from individual layers (either serially or in parallel) independently of the other layers.

20 Claims, 4 Drawing Sheets

US 6,594,171 B1

MEMORY SYSTEMS AND METHODS OF MAKING THE SAME

TECHNICAL FIELD

This invention relates to memory systems and methods of making the same.

BACKGROUND

In general, a memory system includes a plurality of memory elements that are arranged in an array of individually accessible cells. Many different memory systems are available for different applications. For example, volatile memories (e.g., dynamic random access memories), which require a continuous source of power to retain their contents, provide high storage capacity and versatile customization options for microprocessor-based applications. Nonvolatile memories (e.g., read only memories and programmable logic arrays), which do not require a continuous source of power to retain their contents, provide relatively lower storage capacity and limited customization options.

Nonvolatile memories typically store information in one of two ways. In particular, a nonvolatile memory may store a charge or may store a unique physical structure. A charge-storing nonvolatile memory uses a relatively small electrical current to store a charge at a memory element location. A structure-changing memory, on the other hand, typically uses a large electrical current to change the physical structure of a memory element (e.g., a customization or a chalcogenide memory element). In both charge-storing and structure-changing nonvolatile memories, an access device (e.g., access transistor or an access diode) typically provides individual access to an associated memory element. During a read operation, all of the access devices in the memory array are turned off except the access device associated with the particular memory cell to be read.

Three-dimensional memory systems have been proposed to increase the memory cell packing density. For example, U.S. Pat. No. 5,640,760 describes a memory system in which multiple printed circuit boards, each supporting a plurality of electronic component packages (e.g., memory chip packages), are stacked together to form a three-dimensional array of interconnected electronic components. The stack is sliced through to form bars. The pins of the electronic component packages are electrically connected to the side surfaces of the bars by tracks on the printed circuit boards. The packages are connected to each other by side surfaces of the bars. The bars then are sliced through to obtain unit blocks of stacked packages.

SUMMARY

The invention features a memory system that includes multiple memory layers that may be identical when manufactured and may be readily customized before or after the layers are arranged into a three-dimensional stack so that data may be sent to or retrieved from individual layers (either serially or in parallel) independently of the other layers.

In one aspect, the invention features a memory system that includes a stack of N memory layers. Each memory layer includes an array of memory cells each coupled to a common data line, and a set of N input/output (I/O) lines each coupled to the common data line. Only one of the set of N I/O lines provides an electrical communication path to the common data line. The memory system also includes a set of N electrical connectors each electrically connecting a respective output node to a respective set of N corresponding I/O lines. Each set of corresponding I/O lines consists of one I/O line from each of the N memory layers.

Embodiments in accordance with this aspect of the invention may include one or more of the following features.

Preferably, only one I/O line of each set of corresponding I/O lines provides the electrical communication path to the common data line of the corresponding memory layer.

In some embodiments, one of the N I/O lines of each memory layer comprises a shorted customization element and each of the remaining N–1 I/O lines of each memory layer comprises an original, unmodified customization element. For example, each of the customization elements may comprise an element that is characterized originally by a relatively high electrical resistance.

In other embodiments, one of the N I/O lines of each memory layer comprises an original, unmodified customization element and each of the remaining N–1 I/O lines of each memory layer comprises a blown (or electrically open) customization element. For example, each of the customization elements may comprise an element that is characterized originally by a relatively low electrical resistance.

In another aspect, the invention features a method of manufacturing a memory system. In accordance with this inventive method, N of the above-described memory layers are received. The N memory layers are arranged into a stack. Each of a set of N output nodes are electrically connected to a respective set of N corresponding I/O lines, wherein each set of corresponding I/O lines consists of one I/O line from each of the N memory layers.

Embodiments in accordance with this aspect of the invention may include one or more of the following features.

In some embodiments, each of the I/O lines comprises a customization element that is characterized by a relatively high electrical resistance, and the step of customizing a memory layer comprises shorting the customization element corresponding to the I/O line providing the electrical communication path to the common data line. The step of shorting the customization element may comprise applying a voltage across the customization element. The step of shorting the customization element may comprise illuminating the customization element to be shorted while the voltage is being applied to increase electrical conduction through the illuminated customization element. In some embodiments, the step of shorting the customization element may comprise providing an oxidizing atmosphere near the customization element to be shorted while the voltage is being applied.

In other embodiments, each of the I/O lines comprises a customization element that is characterized by a relatively low electrical resistance, and the step of customizing a memory layer comprises blowing the customization elements of all I/O lines except the I/O line providing the electrical communication path to the common data line. The step of blowing the customization elements may comprise applying a voltage across the customization elements. The step of blowing the customization elements may comprise illuminating the customization elements to be blown while the voltage is being applied to increase electrical conduction through the illuminated customization elements. In some embodiments, the step of blowing the customization elements may comprise providing an oxidizing atmosphere near the customization element to be shorted while the voltage is being applied.

In some embodiments, each of the memory layers is customized before the memory layers are arranged into a stack. In other embodiments, each of the memory layers is customized after the memory layers are arranged into a stack.

In another aspect, the invention features a method of manufacturing a memory system. In accordance with this inventive method, N memory layers are received. Each memory layer comprises an array of memory cells each coupled to a common data line, and a set of N input/output (I/O) lines each coupled to the common data line and including a respective customization element. Each of the memory layers is customized by applying a voltage across and illumination to a selected subset of customization elements so that only one of the set of N I/O lines of each memory layer provides an electrical communication path to the common data line.

The applied illumination preferably increases electrical conduction through the illuminated customization elements. In some embodiments, the applied illumination is dithered over one or more of the selected subset of customization elements, and electrical signals induced by illumination in one or more of the selected subset of customization elements are sensed. The illumination may be aligned over one or more of the selected subset of customization elements based upon the sensed illumination-induced electrical signals.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
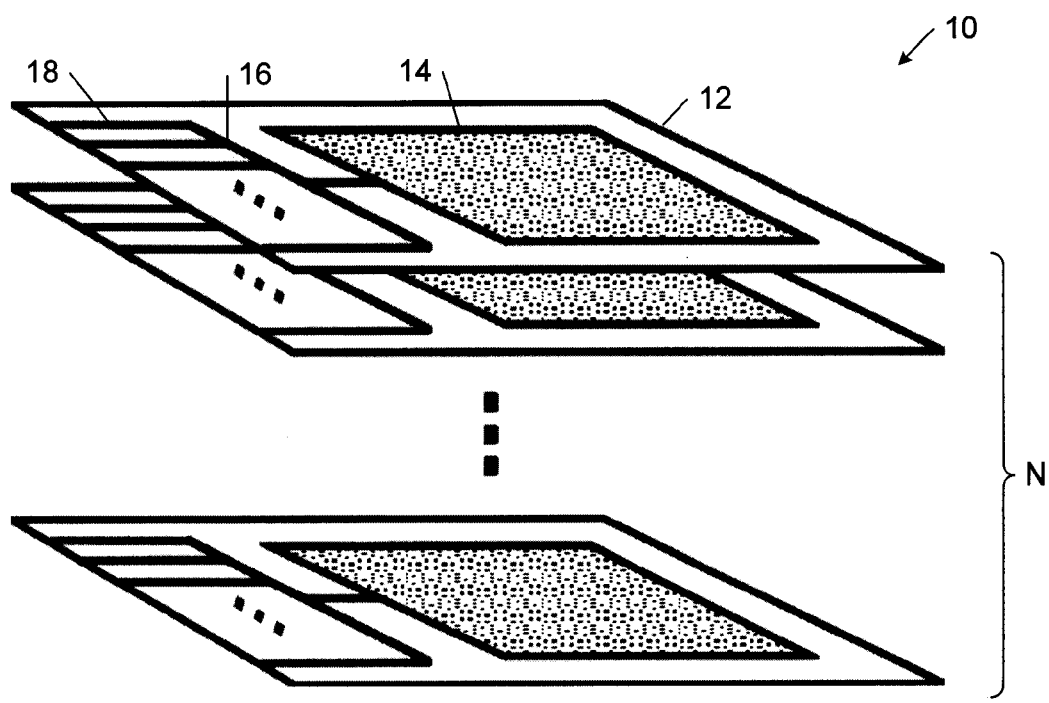
FIG. 1 is a diagrammatic perspective view of N memory layers.
Figure 2:
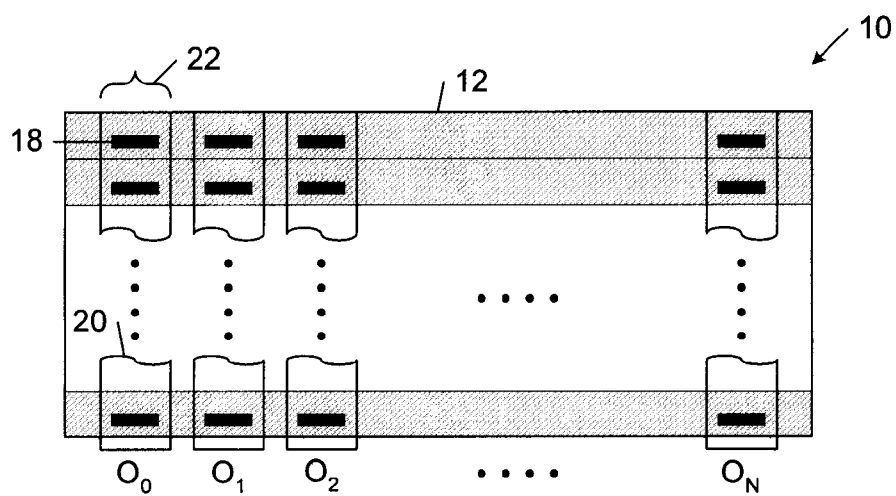
FIG. 2 is a diagrammatic front view of the N memory layers of FIG. 1 arranged into a stack, and a set of N electrical connectors each electrically connecting a respective output node to a respective set of N corresponding I/O lines.

Referring to FIGS. 1 and 2, in one embodiment, a memory system 10 includes a stack of N memory layers 12. Each memory layer includes an array 14 of memory elements (or cells) each coupled to a common data line 16, and a set of N input/output (I/O) lines 18 each coupled to the common data line 16. The memory element array 14 may be implemented as any one of a wide variety of conventional memory element arrays, including conventional volatile and non-volatile memory element arrays. In some embodiments, memory elements of array 14 are implemented as conventional resistive memory elements, such as magnetic random access memory (MRAM) elements, phase change memory elements, resistive polymer memory elements, polysilicon memory elements, and write-once (e.g., fuse based or anti-fuse based) resistive memory elements. In general, the number of I/O lines 18 is equal to or greater than the number of memory layers 12. In the illustrated embodiment, there are N+1 I/O lines: one customization line and N potential access I/O lines. Each memory layer 12 also may include additional I/O lines (e.g., cell addressing lines, and power and ground lines; not shown).

As explained in detail below, the memory layers 12 may be the same when manufactured, but the memory layers 12 may be customized before or after they are arranged into a stack so that only one of the set of N potential access I/O lines 18 provides an electrical communication path to the common data line 16. The memory system 10 also includes a set of N electrical connectors 20 each of which electrically connects a respective output node ($O_0, O_1, O_2, \ldots, O_N$) to a respective set 22 of N corresponding I/O lines 18. Each set 22 of corresponding I/O lines 18 consists of one I/O line 18 from each of the N memory layers 12. Only one I/O line 18 of each set 22 of corresponding I/O lines 18, however, provides the electrical communication path to the common data line 16 of the corresponding memory layer 12. In this way, data may be sent to or retrieved from individual layers (either serially or in parallel) independently of the other layers. In some embodiments, electrical connectors 20 may be implemented as strips of electrically conductive material.

Figure 3:
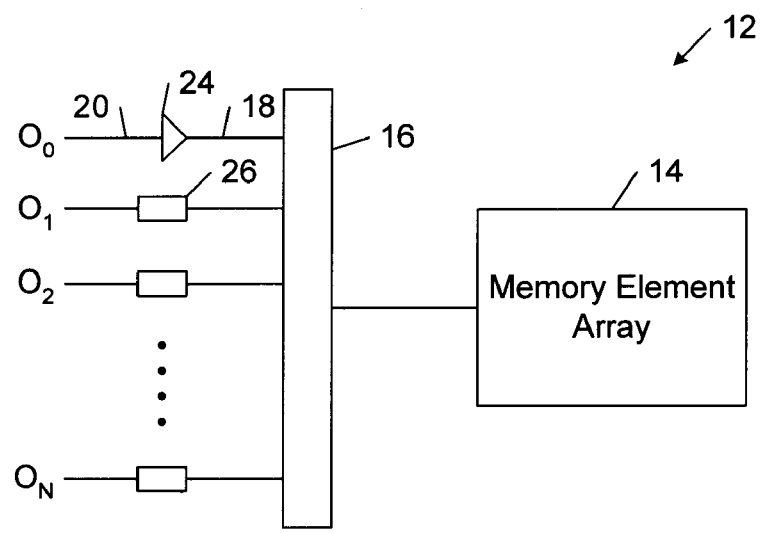
FIG. 3 is a block diagram of a memory layer, including a memory element array and a set of N+1 I/O lines each of which is coupled to the memory element array by a common data line.

Referring to FIG. 3, as mentioned above, each memory layer 12 includes N+1 I/O lines 18, where N is the number of memory layers 12 in memory system 10. Each of the I/O lines 18 is electrically coupled to a respective output node ($O_0, O_1, O_2, \ldots, O_N$) by a respective electrical connector 20. One of the I/O lines 18 corresponds to a customization line and includes a diode 24. Diode 24 is forward biased during the process of customizing the memory layers 12 and is reversed biased under normal operation of memory system 10. Each of the remaining N I/O lines 18 corresponds to a potential access line for the memory layer 12 and includes a respective customization element 26. The customization elements 26 may be modified, for example, by electrically shorting or electrically blowing (or converting to an electrically open state) the customization elements 26, so that only one of the set of N potential access I/O lines 18 provides the electrical communication path to the common data line 16. The customization elements 26 may be implemented in the form of any conventional write-once programmable circuit element, including a resistor element, a conductor element, a fuse element, and an anti-fuse element. In embodiments in which the customization elements are characterized by a relatively high electrical resistance (e.g., resistors or anti-fuses), for each memory layer 12, the customization element of one of the N potential access I/O lines 18 is shorted and the customization elements of the remaining N−1 I/O lines are left unmodified. In embodiments in which the customization elements are characterized by a relatively low electrical resistance (e.g., conductors or fuses), for each memory layer 12, the customization element 26 of one of the N potential access I/O lines 18 is left unmodified and the customization elements 26 of the remaining N−1 I/O lines are blown into an electrically open state.

As mentioned above, the memory layers 12 may be customized before or after they are arranged into a three-dimensional stack.

Figure 4:
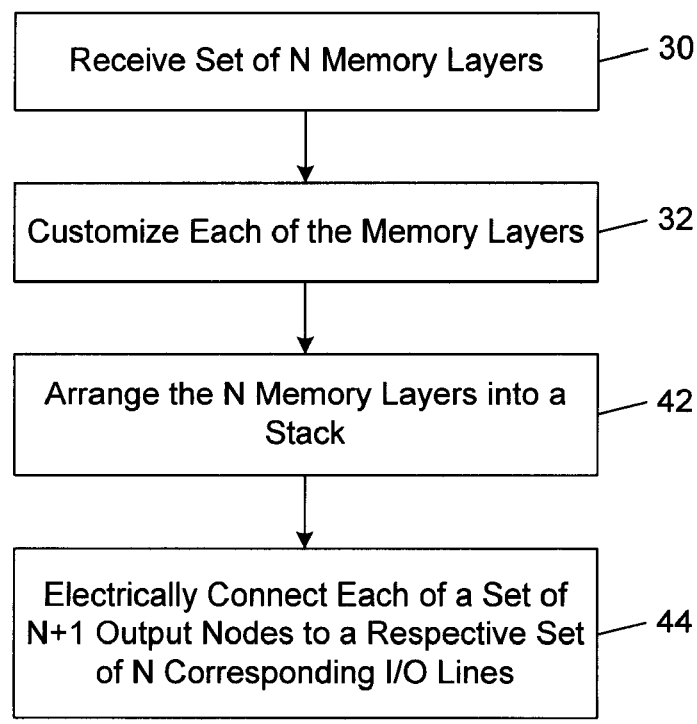
FIG. 4 is a flow diagram of a method of manufacturing a memory system.
Figure 5:
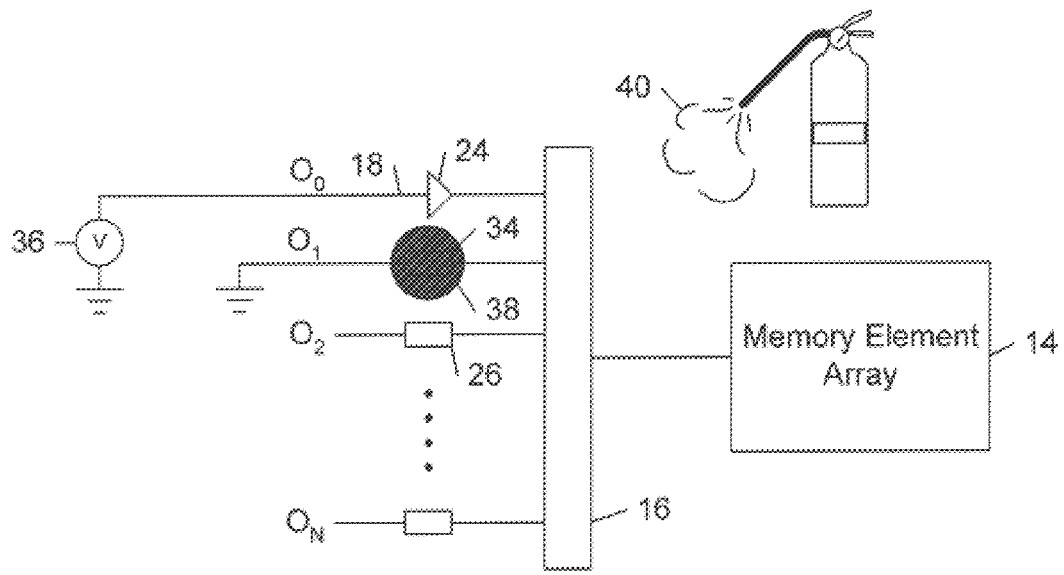
FIG. 5 is a diagrammatic block diagram of a memory layer being customized in accordance with the method of FIG. 4.

Referring to FIGS. 4 and 5, in one embodiment, the memory layers 12 may be customized before they are arranged in a stack as follows. Initially, a set of N memory layers 12 is received (step 30). The memory layers 12 preferably are manufactured to be identical. Each of the layers 12 then is customized so that only one of the set of N potential access I/O lines 18 provides the electrical communication path to the common data line 16 (step 32). As shown in FIG. 5, the process of customizing each memory layer 12 may involve applying a voltage (V) across a target customization element 34. The voltage (V) may be applied, for example, by connecting a voltage source 36 to the output node ($O_0$) corresponding to the customization line and by connecting the output node ($O_1$) corresponding to the target customization element 34 to a source of ground potential. The applied voltage (V) may be high enough to drive sufficient current through the target customization element 34 to short or blow the target customization element 34.

In some embodiments, the applied voltage may be at or below the level needed to short or blow the target customization element 34, but the customization process may be assisted optically or chemically. For example, in some embodiments, the target customization element 34 may be illuminated by light 38 having a wavelength that is absorbed by the target customization element 34. The absorption of light increases electrical conductivity of the target customization element 34 and, thereby, increases current conduction through the target customization element 34 for a given applied bias. In these embodiments, the customization elements 26 preferably are formed from photosensitive material (e.g., amorphous silicon). In some embodiments, the customization process may be assisted by the presence of an oxidizing atmosphere. For example, an oxidizing gas 40 (e.g., oxygen) may be provided near the target customization element 34 while the customization voltage (V) is being applied.

After each of the memory layers 12 has been customized (step 32), the N memory layers are arranged into a stack (step 42). Each of a set of N+1 output nodes ($O_0$, $O_1$, $O_2$, ..., $O_N$) then is electrically connected to a respective set 22 of N corresponding I/O lines 18, each set 22 consisting of one I/O line 18 from each of the N memory layers 12.

Figure 6:
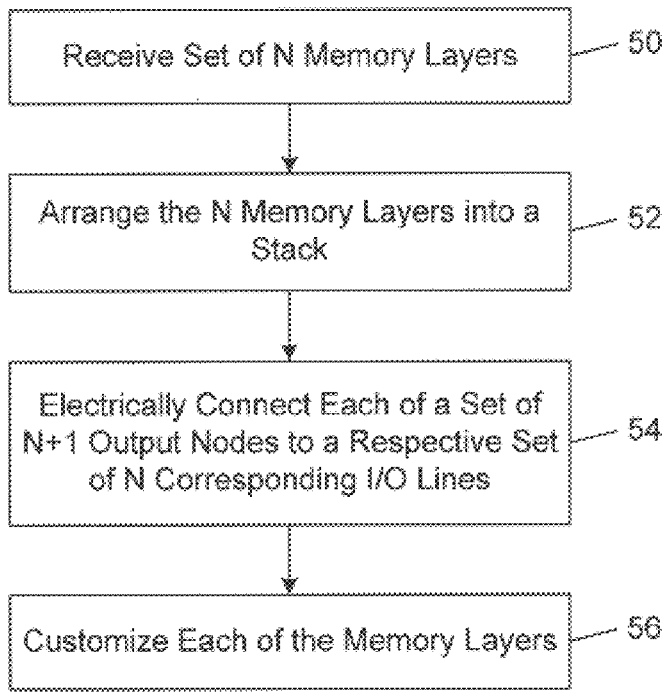
FIG. 6 is a flow diagram of a method of manufacturing a memory system.
Figure 7:
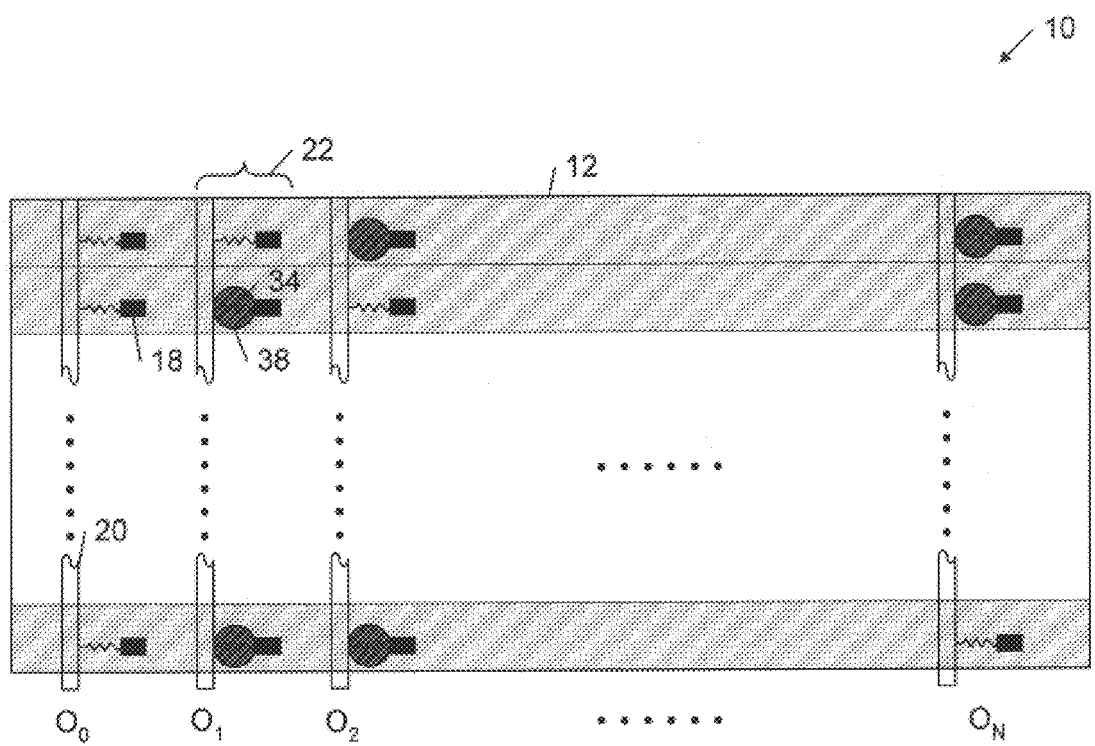
FIG. 7 is a diagrammatic block diagram of a memory layer being customized in accordance with the method of FIG. 6.

Referring to FIGS. 6 and 7, in one embodiment, the memory layers 12 may be customized after they are arranged in a stack as follows. Initially, a set of N memory layers 12 is received (step 50). The memory layers 12 preferably are manufactured to be identical. The N memory layers are arranged into a stack (step 52). After each of the memory layers 12 has been arranged into a stack (step 52), each of a set of N+1 output nodes ($O_0$, $O_1$, $O_2$, ..., $O_N$) then is electrically connected to a respective set 22 of N corresponding I/O lines 18, each set 22 consisting of one I/O line 18 from each of the N memory layers 12 (step 54). Each of the layers 12 then is customized so that only one of the set of N potential access I/O lines 18 provides the electrical communication path to the common data line 16 (step 56).

In this embodiment, a voltage may be applied to the customization output node ($O_0$), and a source of ground potential may be connected to the output node ($O_1$) corresponding to a set 22 of corresponding I/O lines 18 that includes the target customization element 34. In this situation, the corresponding customization elements 26 on each of the memory layers 12 would have an applied voltage drop. While the customization voltage is being applied, the customization elements 26 to be customized may be shorted or blown by illuminating them with light 34 under suitable bias conditions, as described above. In this case, the customization illumination may be applied to the side of the stack of memory layers 12. Each memory layer 12 may have a thickness that is on the order of 10 $\mu$m or greater. In this case, an illumination spot diameter that is on the order of 1 $\mu$m would be sufficient to select individual customization elements. The optical illumination beam may be dithered into alignment over the target customization elements 34 to allow sense electronics associated with the applied voltage to provide the information needed to center the beam on the target customization elements 34. The optical beam also may be modulated to improve the alignment accuracy. This technique, combined with a simple scanning method (e.g., for finding the top memory layer or the bottom memory layer) may enable unambiguous location of a particular target customization element 34.

As shown in FIG. 7, after the memory layers 12 have been customized (step 56), only one of each set 22 of N corresponding I/O lines 18 provides an electrical communication path to the corresponding output node.

Other embodiments are within the scope of the claims.

What is claimed is:

1. A memory system, comprising:
    a stack of N memory layers, each memory layer comprising;
        an array of memory cells each coupled to a common data line, and
        a set of N input/output (I/O) lines each coupled to the common data line,
        wherein only one of the set of N I/O lines provides an electrical communication path to the common data line; and
    a set of N electrical connectors each electrically connecting a respective output node to a respective set of N corresponding I/O lines, each set of corresponding I/O lines consisting of one I/O line from each of the N memory layers.

2. The memory system of claim 1, wherein only one I/O line of each set of corresponding I/O lines provides the electrical communication path to the common data line of the corresponding memory layer.

3. The memory system of claim 1, wherein one of the N I/O lines of each memory layer comprises a shorted customization element and each of the remaining N−1 I/O lines of each memory layer comprises an original, unmodified customization element.

4. The memory system of claim 3, wherein each of the customization elements comprises an element characterized originally by a relatively high electrical resistance.

5. The memory system of claim 1, wherein one of the N I/O lines of each memory layer comprises an original, unmodified customization element and each of the remaining N−1 I/O lines of each memory layer comprises a blown customization element.

6. The memory system of claim 5, wherein each of the customization elements comprises an element characterized originally by a relatively low electrical resistance.

7. A method of manufacturing a memory system, comprising:
    receiving N memory layers, each memory layer comprising;
        an array of memory cells each coupled to a common data line, and a set of N input/output (I/O) lines each coupled to the common data line;

customizing each of the memory layers so that only one of the set of N I/O lines of each memory layer provides an electrical communication path to the common data line;

arranging the N memory layers into a stack; and electrically connecting each of a set of N output nodes to a respective set of N corresponding I/O lines, each set of corresponding I/O lines consisting of one I/O line from each of the N memory layers.

8. The method of claim 7, wherein each of the I/O lines comprises a customization element characterized by a relatively high electrical resistance, and customizing a memory layer comprises shorting the customization element corresponding to the I/O line providing the electrical communication path to the common data line.

9. The method of claim 8, wherein shorting the customization element comprises applying a voltage across the customization element.

10. The method of claim 9, wherein shorting the customization element further comprises illuminating the customization element to be shorted while the voltage is being applied to increase electrical conduction through the illuminated customization element.

11. The method of claim 9, wherein shorting the customization element further comprises providing an oxidizing atmosphere near the customization element to be shorted while the voltage is being applied.

12. The method of claim 7, wherein each of the I/O lines comprises a customization element characterized by a relatively low electrical resistance, and customizing a memory layer comprises blowing the customization elements of all I/O lines except the I/O line providing the electrical communication path to the common data line.

13. The method of claim 11, wherein blowing the customization elements comprises applying a voltage across the customization elements.

14. The method of claim 12, wherein blowing the customization elements further comprises illuminating the customization elements to be blown while the voltage is being applied to increase electrical conduction through the illuminated customization elements.

15. The method of claim 12, wherein blowing the customization elements further comprises providing an oxidizing atmosphere near the customization element to be shorted while the voltage is being applied.

16. The method of claim 7, wherein each of the memory layers is customized before the memory layers are arranged into a stack.

17. The method of claim 7, wherein each of the memory layers is customized after the memory layers are arranged into a stack.

18. The method of claim 7, wherein each of the I/O lines comprises a customization element, and customizing each of the memory layers comprises illuminating a selected subset of customization elements on each memory layer to increase electrical conduction through the illuminated customization elements.

19. A method of manufacturing a memory system, comprising:

receiving N memory layers, each memory layer comprising;
    an array of memory cells each coupled to a common data line, and
    a set of N input/output (I/O) lines each coupled to the common data line and including a respective customization element; and customizing each of the memory layers by applying a voltage across and illumination to a selected subset of customization elements so that only one of the set of N I/O lines of each memory layer provides an electrical communication path to the common data line.

20. The method of claim 19, further comprising:

dithering the applied illumination over one or more of the selected subset of customization elements;

sensing electrical signals induced by illumination in one or more of the selected subset of customization elements; and aligning the illumination over one or more of the selected subset of customization elements based upon the sensed illumination-induced electrical signals.

* * * * *